United States Patent
Zong

(10) Patent No.: US 9,197,177 B2
(45) Date of Patent: Nov. 24, 2015

(54) METHOD AND IMPLEMENTATION APPARATUS FOR INTELLIGENTLY CONTROLLING VOLUME OF ELECTRONIC DEVICE

(71) Applicant: Huawei Device Co., Ltd., Shenzhen (CN)

(72) Inventor: Xianbo Zong, Beijing (CN)

(73) Assignee: Huawei Device Co., Ltd., Shenzhen (CN)

( * ) Notice: Subject to any disclaimer, the term of this patent is extended or adjusted under 35 U.S.C. 154(b) by 166 days.

(21) Appl. No.: 14/060,342

(22) Filed: Oct. 22, 2013

(65) Prior Publication Data

US 2014/0112498 A1 Apr. 24, 2014

(30) Foreign Application Priority Data

Oct. 23, 2012 (CN) .......................... 2012 1 0407424

(51) Int. Cl.
*H03G 3/20* (2006.01)
*H04R 3/00* (2006.01)
*G10L 25/78* (2013.01)
*G10L 25/48* (2013.01)

(52) U.S. Cl.
CPC ................ *H03G 3/20* (2013.01); *H04R 3/005* (2013.01); *G10L 25/48* (2013.01); *G10L 25/78* (2013.01); *H04R 2430/01* (2013.01)

(58) Field of Classification Search
None
See application file for complete search history.

(56) References Cited

U.S. PATENT DOCUMENTS

| 2007/0189544 | A1* | 8/2007 | Rosenberg | 381/57 |
| 2010/0111328 | A1 | 5/2010 | Yu | |
| 2010/0146445 | A1* | 6/2010 | Kraut | 715/821 |
| 2010/0290633 | A1 | 11/2010 | Chen et al. | |
| 2012/0039489 | A1* | 2/2012 | Chen et al. | 381/107 |
| 2014/0247952 | A1* | 9/2014 | Goldstein | 381/74 |

FOREIGN PATENT DOCUMENTS

| CN | 1645971 A | 7/2005 |
| CN | 1897054 A | 1/2007 |
| CN | 101166017 A | 4/2008 |
| CN | 101917656 A | 12/2010 |

(Continued)

OTHER PUBLICATIONS

Japanese Office Action received in Application No. 2013-219719, mailed Nov. 18, 2014, 8 pages.

(Continued)

*Primary Examiner* — Andrew L Sniezek

(57) ABSTRACT

The present invention discloses a method and an implementation apparatus for intelligently controlling volume of an electronic device, where the electronic device is installed with microphones. The method includes receiving an external sound picked up by the microphones, extracting content information of the external sound, determining, according to the content information of the external sound, whether a prestored sound template database includes a sound that is matched with the content information of the external sound, and generating a first determining result. If the first determining result is yes, the method includes adjusting volume of a sound that is being output, or generating a prompt tone, turning off a sound that is being output, and outputting the prompt tone. In the present invention, an electronic device is enabled to intelligently control its own volume according to an external sound.

13 Claims, 6 Drawing Sheets

(56) References Cited

FOREIGN PATENT DOCUMENTS

| | | |
|---|---|---|
| CN | 102056042 A | 5/2011 |
| CN | 102915753 A | 2/2013 |
| JP | 02274007 H | 8/1990 |
| JP | 03006797 | 1/1991 |
| JP | 11161154 | 6/1999 |
| JP | 2000308198 A | 11/2000 |
| JP | 3163868 | 3/2001 |
| JP | 2004013084 A | 1/2004 |
| JP | 2008167319 A | 7/2008 |
| JP | 2010154260 A | 7/2010 |
| JP | 2011205324 | 10/2011 |
| JP | 201274976 A | 4/2012 |
| KR | 20100035042 A | 4/2010 |
| WO | 2008047945 A1 | 4/2008 |

OTHER PUBLICATIONS

Extended European Search Report received in Application No. 13189498.2-1910, Applicant: Huawei Device Co., Ltd., mailed Jan. 30, 2014, 6 pages.

International Search Report received in Application No. PCT/CN2013/085628, mailed Jan. 30, 2014, 11 pages.

* cited by examiner

METHOD AND IMPLEMENTATION APPARATUS FOR INTELLIGENTLY CONTROLLING VOLUME OF ELECTRONIC DEVICE

CROSS-REFERENCE TO RELATED APPLICATIONS

This application claims priority to Chinese Patent Application No. 201210407424.0, filed on Oct. 23, 2012, which is hereby incorporated by reference in its entirety.

TECHNICAL FIELD

The present invention relates to the field of volume adjustment, and in particular, to a method and an implementation apparatus for intelligently controlling volume of an electronic device.

BACKGROUND

To meet users' demands, most earphones configured for present electronic devices have a noise reduction function and are capable of canceling external noise, so that people are "isolated from the world" after putting on earphones and shall not hear external noise. However, this manner results in that a user often cannot give timely feedback on an external situation. For example, if a user is listening to music with earphones while bicycling on a road, the user would not hear sounds of horns of nearby vehicles, which easily leads to an accident. Similarly, when a user is listening to music while exercising, the user would not hear greetings from others. There are still a lot of similar situations, which cause unnecessary troubles for users.

SUMMARY

An objective of the present invention is to provide a method and an implementation apparatus for intelligently controlling volume of an electronic device, so as to enable the electronic device to intelligently control its own volume according to an external sound, so that a user may give timely feedback on the external sound.

In a first aspect, an embodiment of the present invention provides a method for intelligently controlling volume of an electronic device, where the electronic device is installed with microphones, and the method includes:

receiving an external sound picked up by the microphones;

extracting content information of the external sound;

determining, according to the content information of the external sound, whether a prestored sound template database includes a sound that is matched with the content information of the external sound, and generating a first determining result; and if the first determining result is yes, adjusting volume of a sound that is being output;

or generating a prompt tone, turning off a sound that is being output, and outputting the prompt tone.

In a first possible implementation manner of the first aspect, the generating a prompt tone, turning off a sound that is being output, and outputting the prompt tone includes:

generating a corresponding prompt tone according to the content information of the external sound, turning off the sound that is being output, and outputting the corresponding prompt tone.

In combination with the first aspect or the first possible implementation manner of the first aspect, in a second possible implementation manner, the number of the microphones is at least two; where before the adjusting volume of a sound that is being output or before the generating a prompt tone, turning off a sound that is being output, and outputting the prompt tone, the method further includes:

calculating, according to a microphone array formed by the at least two microphones, a position of a sound source of the external sound and a distance between the sound source of the external sound and the electronic device; and the adjusting volume of a sound that is being output or the generating a prompt tone, turning off a sound that is being output, and outputting the prompt tone includes:

determining whether the position of the sound source of the external source and the distance meet a preset condition, and generating a second determining result; and if the second determining result is yes, adjusting the volume of the sound that is being output, or generating the prompt tone, turning off the sound that is being output, and outputting the prompt tone.

In combination with the second possible implementation manner of the first aspect, in a third possible implementation manner, the calculating, by using a microphone array formed by the at least two microphones, a position of the external sound and a distance between the external sound and the electronic device includes:

calculating a sound arrival delay between array element pairs formed by two microphones in the array formed by the at least two microphones; and calculating, according to the arrival delay and a position relationship between the microphones, the distance between the external sound and the electronic device, and determining the position of the external sound.

In combination with the first aspect or the first to the third possible implementation manners of the first aspect, in a fourth possible implementation manner, the at least two microphones are omnidirectional microphones.

In combination with the second to the fourth possible implementation manners of the first aspect, in a fifth possible implementation manner, the determining whether the position of the sound source of the external source and the distance meet a preset condition, and generating a second determining result includes:

inputting the position of the sound source and the distance into a threshold circuit, comparing the position of the sound source and the distance with preset thresholds in the threshold circuit, and generating a comparing result; and outputting a high-level signal to an audio processing chip if the comparing result conforms to a preset relationship; otherwise, outputting a low-level signal to the audio processing chip;

the if the second determining result is yes, adjusting the volume of the sound that is being output, or generating the prompt tone, turning off the sound that is being output, and outputting the prompt tone includes:

when the high-level signal is received, calling an automatic gain control AGC function by using the audio processing chip to adjust the volume of the sound that is being output, or generate the prompt tone, turn off the sound that is being output, and output the prompt tone.

In a second aspect, an embodiment of the present invention further provides an implementation apparatus for intelligently controlling volume of an electronic device, where the electronic device is installed with microphones, and the apparatus includes:

a receiving unit, configured to receive an external sound picked up by the microphones;

a content extracting unit, configured to extract content information of the external sound;

a content determining unit, configured to determine, according to the content information of the external sound, whether a prestored sound template database includes a sound that is matched with the content information of the external sound, and generate a first determining result; and a volume controlling unit, including a volume adjusting unit or a prompt tone unit, where the volume adjusting unit is configured to, when the first determining result is yes, adjust volume of a sound that is being output; and the prompt tone unit is configured to, when the first determining result is yes, generate a prompt tone, turn off a sound that is being output, and output the prompt tone.

In a first possible implementation manner of the second aspect, the prompt tone generating unit is specifically configured to, when the first determining result is yes, generate a corresponding prompt tone according to the content information of the external sound, turn off the sound that is being output, and output the corresponding prompt tone.

In combination with the first aspect or the first possible implementation manner of the first aspect, in a second possible implementation manner, the number of the microphones is at least two; where the apparatus further includes:

a position determining unit, configured to calculate, according to a microphone array formed by the at least two microphones, a position of a sound source of the external sound and a distance between the sound source of the external sound and the electronic device;

the volume controlling unit further includes:

a condition determining unit, configured to, when the first determining result is yes, determine whether the position of the sound source and the distance meet a preset condition, and generate a second determining result;

the volume adjusting unit is specifically configured to, when the second determining result is yes, adjust the volume of the sound that is being output; and the prompt tone unit is specifically configured to, when the second determining result is yes, generate the prompt tone, turn off the sound that is being output, and output the prompt tone.

In combination with the second possible implementation manner of the first aspect, in a third possible implementation manner, the position determining unit includes:

a delay calculating unit, configured to calculate a sound arrival delay between array element pairs in the array formed by the at least two microphones; and a sound positioning unit, configured to calculate, according to the arrival delay and a position relationship between the microphones, the distance between the external sound and the electronic device, and determine the position of the external sound.

In combination with the first or the second possible implementation manner of the first aspect, in a third possible implementation manner, the at least two microphones are omnidirectional microphones.

In combination with the first to the third possible implementation manners of the first aspect, in a fourth possible implementation manner, the condition determining unit is specifically configured to input the position of the sound source and the distance into a threshold circuit, compare the position of the sound source and the distance with preset thresholds in the threshold circuit respectively, and generate a comparing result; if the comparing result conforms to a preset relationship, output a high-level signal to an audio processing chip; otherwise, output a low-level signal to the audio processing chip;

the volume adjusting unit is specifically configured to, when the high-level signal is received, call an automatic gain control AGC function by using the audio processing chip to adjust the volume of the sound that is being output; and the prompt tone unit is specifically configured to, when the high-level signal is received, call an automatic gain control AGC function by using the audio processing chip to generate the prompt tone, turn off the sound that is being output, and output the prompt tone.

According to the specific embodiments provided by the present invention, the present invention discloses the following technical effects:

In the present invention, an external sound is picked up, content information of the external sound is extracted, the content information is matched with a prestored sound, and when a match is made, volume of a sound that is being output is adjusted, or a sound that is being output is turned off and a prompt tone is output, so as to enable an electronic device to intelligently control its own volume according to the external sound, so that a user may give timely feedback on the external sound.

BRIEF DESCRIPTION OF DRAWINGS

To illustrate the technical solutions in the embodiments of the present invention more clearly, accompanying drawings required for describing the embodiments are briefly introduced in the following. Apparently, the accompanying drawings in the following description show merely some embodiments of the present invention, and persons of ordinary skill in the art may still derive other drawings according to these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the embodiments to be described are merely a part rather than all of the embodiments of the present invention. All other embodiments obtained by persons of ordinary skill in the art based on the embodiments of the present invention without creative efforts shall fall within the protection scope of the present invention.

Figure 1:
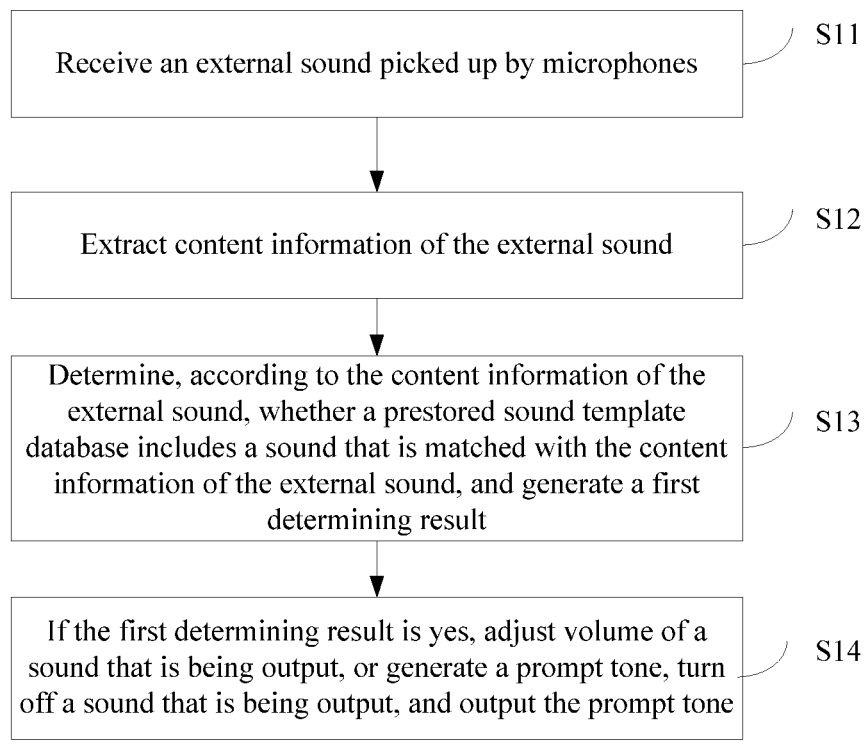
FIG. 1 is a flowchart of a method according to a first embodiment of the present invention.

Referring to FIG. 1, a process of a method for intelligently controlling volume of an electronic device according to a first embodiment of the present invention specifically includes:

S11: Receive an external sound picked up by microphones.

The microphones (MIC, Microphone) are installed in the electronic device, and are used to pick up an external sound signal and convert the external sound signal into an electrical signal. Therefore, the external sound received currently is actually an electronic signal obtained through conversion by the microphones.

According to a sound pick-up capability of a microphone in various directions, namely sound sensitivity to different directions, current microphones are mainly divided into three types: omnidirectional, bidirectional, and unidirectional.

The omnidirectional means that a microphone has same sensitivity to sounds in all directions and may pick up sounds evenly from all directions, that is, a difference in installing directions of the microphone does not lead to a volume difference of a sound that is picked up. Therefore, an omnidirectional microphone may not necessarily point at a specific direction.

The bidirectional means that a microphone is mainly relatively sensitive to sounds on both sides of the microphone and may pick up external sounds from both sides of the microphone.

The unidirectional means that a microphone is mainly sensitive to sounds from one direction and may pick up external sounds from one direction. When picking up an external sound, a unidirectional microphone needs to point at a specific direction.

In the embodiment of the present invention, any of the foregoing types of microphones may be used. However, in order to ensure that sounds from all directions are obtained evenly, in the embodiment of the present invention, an omnidirectional microphone may be used.

S12: Extract content information of the external sound.

Specifically, a key feature of the received electrical signal may be analyzed. Then, voice content corresponding to the electrical signal is extracted.

It should be noted that, generally, an external sound directly picked up by the microphones is mixed with noise, and a voice signal of the noise damages an original acoustic feature of the external sound, thereby deteriorating sound quality and reducing intelligibility. In order to remove a noise part from a voice signal that includes noise as much as possible to obtain a pure original sound, noise suppression may be performed first in the embodiment of the present invention. Common methods mainly include an adaptive noise cancellation method, a spectral subtraction method, a model establishment method, a noise removing method by using a filter, a blind source separation method, and the like.

S13: According to the content information of the external sound, determine whether a prestored sound template database includes a sound that is matched with the content information of the external sound, and generate a first determining result.

In the present invention, a sound template database may be pre-established, and content information of specified sounds is stored in the sound template database. For example, sounds of horns of vehicles, sounds of people's greetings, sounds of thunders, and so on are stored. In a specific embodiment, a user may prestore different specified sounds in the sound template database according to the user's own needs.

The sound template database may be stored in the electronic device. When the content information of the external sound is extracted, the electronic device directly searches its own sound template database to check whether there is a sound that is the same or similar to the extracted content of the external sound.

In an optional embodiment of the present invention, a sound template database may also be stored on the cloud to save storage space of an electronic device. The electronic device may upload the extracted content information of the external sound onto the cloud for performing matching determination, and the sound template database may also be downloaded into the electronic device for performing matching.

In the embodiment, the user may prestore all specified sounds into the sound template database. However, this manner needs to occupy a large amount of storage space, and lots of time and resources are required for performing searching and matching in all the specified sounds. In an actual application, in different environments, external sounds that a user needs to pay attention to differ greatly. For example, when in an indoor environment such as a gym, a user generally does not pay attention to sounds of vehicles. In view of this, the present invention provides two optional manners.

In a first manner, first, divide sounds into a plurality of sound template databases according to differences of corresponding external environments. For example, in an indoor sound template database, greeting sounds, such as "Hi" and "Hello", are stored, and in an outdoor sound template database, sounds of horns of vehicles, stop-reporting sounds of vehicles, and the like are stored. Then, make a priority division for the sound template databases according to external environments and by following a certain rule. Generally, a specified sound database corresponding to a current external environment has a highest priority, and other priorities may be sequentially set. After extracting the content information of the external sound, the electronic device performs searching and matching according to priority order. Only when matching information is not found in a sound template database that has a higher priority, the electronic device continues to perform searching and matching in a sound template database that has a lower priority.

For example, when in a gym, the user selects an indoor environment mode in the electronic device, and then, the electronic device determines, according to the external environment determined by the user and by following a preset rule, that the indoor sound template database has a highest priority and the outdoor sound template database has a lower priority. When picking up a certain external sound, the electronic device first searches the indoor sound template database for content information of the external sound. Only when no matching sound is found, the electronic device searches the outdoor sound template database. Compared with a manner of searching all sound template databases without any order, this manner reduces a searching and matching workload.

In a second manner, first, divide sounds into a plurality of sound template databases according to differences of corresponding external environments, such as the indoor sound template database and the outdoor sound template database mentioned above. Then, store only a sound template database corresponding to a current external environment in the electronic device. For example, when in a gym, by selecting an indoor environment mode, a corresponding indoor sound template database is downloaded from the cloud and stored.

The following is a specific application scenario of the foregoing second manner of the present invention:

After entering a gym, a user A selects an indoor environment in a cell phone, and consequently, the cell phone downloads a corresponding indoor sound template database from the cloud and stores the database. In the indoor sound template database, four specified sounds, "Hi", "Hello", "What are you doing", and "long time no see", are stored.

Then, the user A connects earphones to the cell phone and listens to music while exercising. At this time, a person passes by and greets the user A with "Hello". Microphones on the cell phone of the user A pick up the sound, and the cell phone extracts content information of the sound, searches the indoor sound template database stored by the cell phone itself to check whether there is a specified sound that is the same or similar to the extracted content information, and generates a first determining result.

S14: If the first determining result is yes, adjust volume of a sound that is being output, or generate a prompt tone, turn off a sound that is being output, and output the prompt tone.

When a specified sound that is matched with the content of the external sound is found in the sound template database, the electronic device may adjust the volume of the sound that is being output; and specifically, the electronic device may turn down or turn off the volume of the sound that is being output, so that the user can hear the external sound.

When the device is faulty, the volume of the sound that is being output may also be turned down or turned off. Therefore, for ease of differentiation by the user, in another embodiment of the present invention, when the first determining result is yes, the prompt tone may be generated, the sound that is being output may be turned off, and the prompt tone may be output. Specifically, the prompt tone may be a word, a simple sentence, and may also be a piece of music. The present invention does not limit a specific form of the prompt tone.

It should be noted that, because the prompt tone is output after the electronic device picks up the external sound, the user does not hear the specific content of the external sound. Therefore, in an optional embodiment of the present invention, a corresponding prompt tone may be generated according to the extracted content information of the external sound, and the corresponding prompt tone is output to the user after the volume of the sound that is being output is turned off. For example, a cell phone picks up an external sound "Hello", and finds, by searching and matching, a specified sound that is matched with the external sound in the sound template database. Therefore, a prompt tone "Someone is greeting you" or "Someone is saying hello" is generated and then output to the user.

In the foregoing embodiment, it may be temporary that the electronic device adjusts the volume of the sound that is being output or turns off the sound that is being output to output the prompt tone. For example, the user may set a fixed period of time. After the electronic device adjusts volume or outputs a prompt tone, original volume automatically recovers after this fixed period of time. A corresponding time detecting apparatus may be installed in the electronic device to detect time.

For example, the user sets the fixed period of time to 2 minutes. At a certain time point, the electronic device turns off a sound that is being output and outputs a corresponding prompt tone because the electronic device picks up a specific external sound. After detecting that 2 minutes pass, the time detecting apparatus generates a relevant signal. Then, the electronic device may adjust the sound back to the original volume according to the signal.

Certainly, in other embodiments of the present invention, it may also be set that after an electronic device adjusts volume or outputs a prompt tone, a sound is consistently output at the adjusted volume or the sound is kept in a turning off state unless a user performs manual setting.

In actual life, sounds that have same content information do not necessarily have a same impact on a user. For example, when driving on a road, a user usually neither pays attention to sounds of horns of vehicles ahead and nor pays attention to sounds of horns of vehicles that are far away from the user. Therefore, both a position and a distance of a sound source of an external sound have an impact on a user. In view of this, a second embodiment of the present invention provides a method for intelligently controlling volume of an electronic device. For a specific process, reference may be made to FIG. 2.

S21: Receive an external sound picked up by microphones.

S22: Extract content information of the external sound.

S23: According to the content information of the external sound, determine whether a prestored sound template database includes a sound that is matched with the content information of the external sound, and generate a first determining result.

S24: Calculate a position of a sound source of the external sound and a distance between the sound source of the external sound and the electronic device. It should be noted that, step S24 is not necessarily performed after step S23, and only needs to be performed after step S21 and before step S25.

Figure 2:
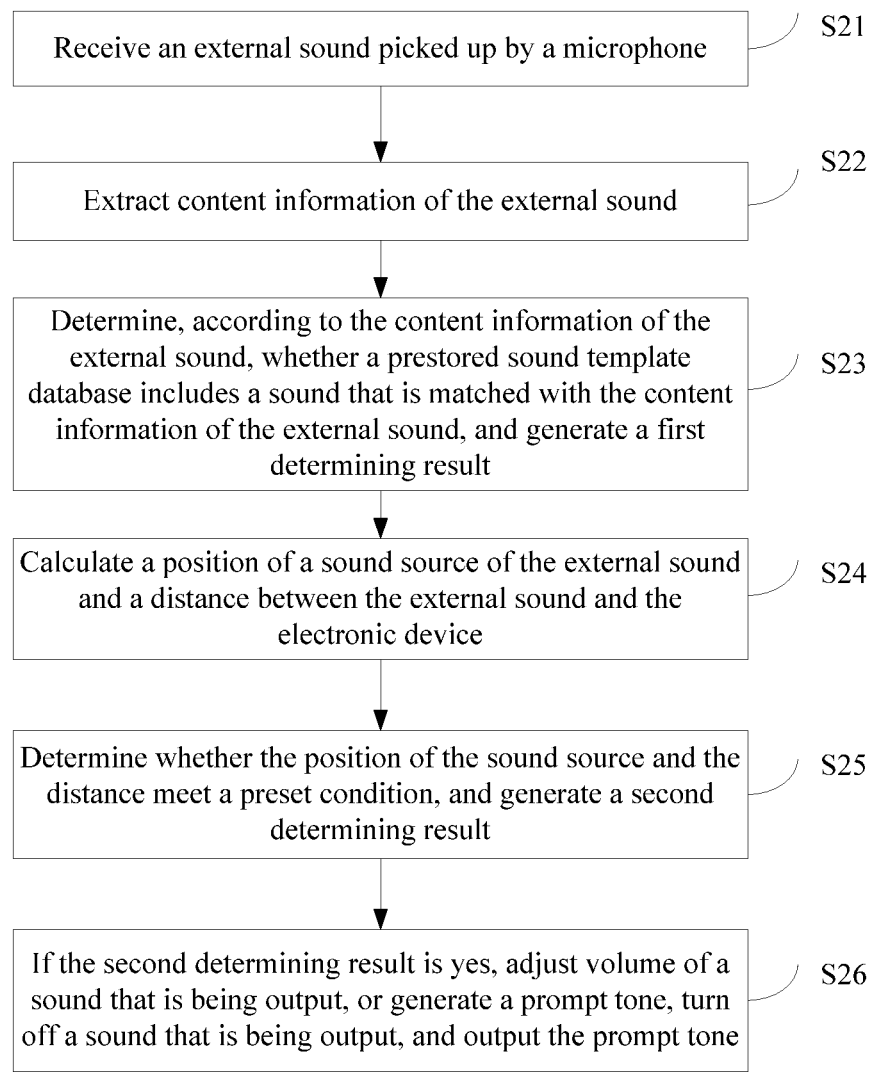
FIG. 2 is a flowchart of a method according to a second embodiment of the present invention.

FIG. 2 of the present invention shows a situation that step S24 is performed after step S23 and the first determining result is yes.

S25: Determine whether the position of the sound source and the distance meet a preset condition, and generate a second determining result.

Volume of a sound source can reflect, to a certain extent, a distance between the sound source and an electronic device. Therefore, in another embodiment of the present invention, volume of the sound source of the external sound may be further calculated in step S24. Correspondingly, in step S25, whether the external sound meets the preset condition may be determined in combination with the volume.

In the present invention, different preset conditions may be set according to a requirement in view of sounds having different content. For example, for sounds of horns of vehicles, a preset condition may be set to: a position is in the rear and a distance is shorter than 500 meters; and for sounds of greetings, a preset condition may be set to: a distance is shorter than 200 meters.

It should be noted that, in the present invention, when a certain item in the preset condition is blank, it is considered by default that the item does not need to be determined For example, when an item corresponding to the volume is blank, it is considered by default that sounds at all volume meet a requirement.

S26: If the second determining result is yes, adjust volume of a sound that is being output, or generate a prompt tone, turn off a sound that is being output, and output the prompt tone.

There are a plurality of methods for calculating the volume of the sound, the position of the sound, and the distance between the sound and the electronic device in step S24.

In the present invention, the volume may be calculated according to a signal-to-noise ratio. It is known that energy of a low vowel, a high vowel, an unvoiced sound, and the like is differently distributed in different frequency bands. Therefore, in an optional embodiment of the present invention, the volume may be calculated in combination with a factor such as a frequency band. The foregoing calculation may be implemented by using the prior art and is not further described in detail in the present invention.

With regard to the calculation of the position of the sound and the distance between the sound and the electronic device, in the present invention, the calculation may be performed according to a reverberation degree or a microphone frequency response, and may also be performed by using a distributed microphone array method. The distributed microphone array refers to an array formed by at least two separately distributed microphones. A theory is that a relationship between an external sound and at least two separately distributed microphones as well as a geometric positional relationship between the microphones are used to position a sound source. The distributed microphone array method is specifically divided into a beam-based algorithm, an algorithm based on high-resolution spectral estimation, and an algorithm based on an arrival delay. It should be noted that, when the beam-based algorithm and the algorithm based on high-resolution spectral estimation are used to perform a calculation, the number of the microphones is at least three.

The algorithm based on an arrival delay is taken as an example in the following to introduce the method for calculating a position of a sound and a distance between the sound and an electronic device by using the distributed microphone array method in detail:

First, calculate a sound arrival delay between array element pairs formed by two microphones in a microphone array. Common methods include a least mean square adaptive filter method, a cross power spectrum phase method, and a generalized cross-correlation function method. The method based on a generalized cross-correlation function has a small calculating amount and high calculating efficiency. In the embodiment of the present invention, this method may be used to calculate the arrival delay.

Figure 3:
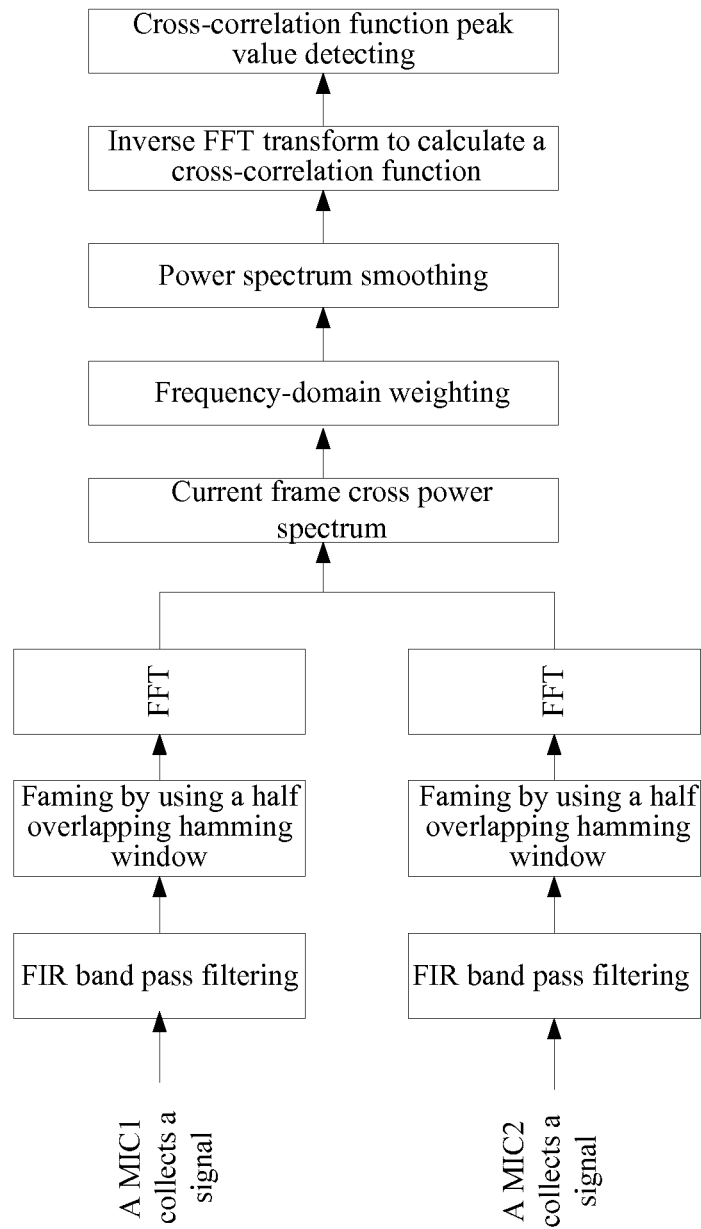
FIG. 3 is a flowchart of a process for calculating an arrival delay according to an embodiment of the present invention.

A specific process is as shown in FIG. 3:

Step 1: Array element pairs, a microphone 1 and a microphone 2, obtain a voice signal of an external sound, and a voice signal to be processed is obtained through A/D sampling and a low pass filter.

In a specific application, the microphones 1 and 2 may be set at will. However, in order to achieve a better effect, the microphones 1 and 2 need to ensure a good sealing effect and cannot be placed at a position that may be easily covered by a hand. It is best to place the microphones on a central axis of the electronic device and isolate the two microphones from each other to a certain extent.

Step 2: After the voice signal to be processed passes a FIR band pass filter, perform framing by using a half overlapping hamming window and Fourier transform to obtain a cross power spectrum of the voice signal to be processed.

Step 3: To reduce impacts of noise and reverberation, frequency-domain weighting may be performed to obtain a power spectrum after the weighting.

Step 4: To further highlight a peak value, smooth a power spectrum between microphone signals to obtain a power spectrum after the smoothing.

Step 5: Calculate an inverse Fourier transform value of the power spectrum to obtain a generalized cross-correlation function between the microphone array element pairs.

Step 6: Calculate a peak value of the generalized cross-correlation function, namely the arrival delay between the microphone array element pairs.

It should be noted that both step 3 and step 4 are optional steps.

Then, use time delay estimation to perform position estimation. Common methods include an angular distance positioning method, a spherical interpolation method, a linear interpolation method, and an objective function spatial search positioning method. In the embodiment of the present invention, the angular distance positioning method that has moderate precision and is easy to be implemented may be used to perform the positioning.

According to an existing angular distance positioning method, a distance from the sound source to an origin is $$r = \frac{d_{14}^2 - (d_{12}^2 + d_{13}^2)}{2(d_{12} + d_{13} - d_{14})},$$

where $d_{ij}$ refers to a distance between an $i^{th}$ microphone and a $j^{th}$ microphone. Assume that an arrival delay between the microphone array element pairs that is calculated before is $t_{ij}$, then $d_{ij} = C*t_{ij}$, where C refers to a propagation speed of the sound.

According to the angular distance positioning method, a horizontal angle $\theta_{azimuth}$ between the sound source and the origin is:

$$\theta_{azimuth} = \cos^{-1}\left(\frac{d}{2a}\right),$$

where a refers to spacing between the microphone array element pairs, and d refers to a difference of distances between the sound source and the microphone array element pairs.

An elevation $\phi_{elevation}$ between the sound source and the origin is:

$$\varphi_{elevation} = \cos^{-1}\left(\frac{d}{a}\right),$$

where a refers to spacing between the microphone array element pairs, and d refers to a difference of distances between the sound source and the microphone array element pairs.

It can be known from the foregoing that, an arc cosine function value needs to be calculated to determine a corresponding angular value. The arc cosine function value is a transcendental function, and Taylor series may be used to approximately calculate this function. However, this method is complicated and is not accurate enough. In the present invention, a CORDIC algorithm formed by shifting and addition and subtraction may be used. A system uses a high-speed 9-stage pipeline structure to implement the CORDIC algorithm. An iteration relationship is as follows:

$$x_0 = 1; \tag{1}$$
$$y_0 = 0;$$
$$t_0 = t;$$
$$\theta_0 = 0$$

$$d_n = \text{sign}(y_n), \tag{2}$$
$$\text{if } x_n \geq t_n;$$
$$\text{else } -\text{sign}(y_n)$$

$$\begin{pmatrix} x_{n+1} \\ y_{n+1} \end{pmatrix} = \begin{pmatrix} 1 & -d_n 2^{-n} \\ d_n 2^{-n} & 1 \end{pmatrix}^2 \begin{pmatrix} x_n \\ y_n \end{pmatrix} \tag{3}$$

$$t_{n+1} = t_n + t_n 2^{-2n} \tag{4}$$

$$\theta_{n+1} = \theta_n + 2d_n \tan^{-1} 2^{-n} \tag{5}$$

Formula (1) is an initial condition of an iteration; formula (2) is for determining a direction of a next iteration according to a coordinate value of this time; and formula (3) to formula (5) are formulas of the next iteration. A value of θ through several times of iterations for the algorithm is a result to be calculated. In actual implementation, using a 9-stage iteration may obtain 7-digit precision. The least angular precision is 0.111 905.

It should be noted that, when whether the volume, the position, and the distance meet the preset condition is specifically determined, the preset condition may be set in a threshold circuit in a form of preset thresholds, then, the volume and the position of the external sound and the distance are input into the threshold circuit for a comparison, and a comparing result is generated. When the comparing result conforms to a preset relationship, output a high-level signal to an audio processing chip. When the high-level signal is received, call an automatic gain control AGC function by using the audio processing chip to adjust the volume of the sound that is being output, or generate the prompt tone, turn off the sound that is being output, and output the prompt tone. If the comparing result does not conform to the preset relationship, it is considered that the preset condition is not met; then output a low-level signal to the audio processing chip.

Specifically, the preset thresholds in the threshold circuit may be set to: a distance is 500 meters and a preset relationship is less than. When the distance between the sound source of the external sound and the electronic device is 400 meters and the comparing result is less than, that is, the preset relationship is conformed to, output a high-level signal in this case.

When the threshold circuit includes a plurality of thresholds, such as a volume threshold, a position threshold, and a distance threshold, and results of comparing the external sound with the plurality of thresholds all conform to the preset relationship, output a high-level signal. When there is one item that does not conform to the preset relationship, output a low-level signal.

In conclusion, in the method in the present invention, an external sound is picked up, content information of the external sound is extracted, the content information is matched with a prestored specific sound, and when the external sound is matched with a specific sound, volume of a sound that is being output is adjusted, or a prompt tone is generated, a sound that is being output is turned off, and the prompt tone is output, so as to enable an electronic device to intelligently control its own volume according to a sound in an external environment.

Figure 4:
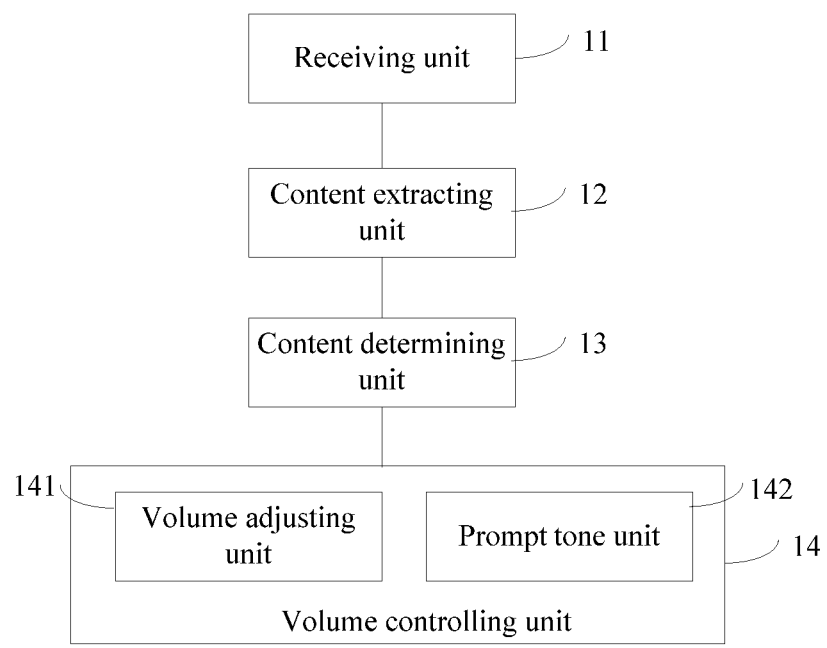
FIG. 4 is a structural diagram of an apparatus according to a third embodiment of the present invention.

Corresponding to the foregoing method, a third embodiment of the present invention further provides an implementation apparatus for intelligently controlling volume of an electronic device. As shown in FIG. 4, the apparatus includes:

A receiving unit 11 is configured to receive an external sound picked up by microphones.

The microphones (MIC, Microphone) are installed in the electronic device, and are used to pick up an external sound signal and convert the external sound signal into an electrical signal. Therefore, the external sound received currently is actually an electronic signal obtained through conversion by the microphones.

According to a sound pick-up capability of a microphone in every direction, namely sound sensitivity to every direction, current microphones are mainly divided into three types: omnidirectional, bidirectional, and unidirectional.

The omnidirectional means that a microphone has same sensitivity to sounds in all directions and may pick up sounds evenly from all directions. Therefore, an omnidirectional microphone may not necessarily point at a specific direction.

The bidirectional means that a microphone is mainly relatively sensitive to sounds on both sides of the microphone and may pick up external sounds from both sides of the microphone.

The unidirectional means that a microphone is mainly sensitive to sounds from one direction and may pick up external sounds from one direction. When picking up an external sound, a unidirectional microphone needs to point at a specific direction.

In the embodiment of the present invention, any of the foregoing types of microphones may be used. However, in order to ensure that sounds from all directions are obtained evenly, in the present invention, an omnidirectional microphone may be used.

A content extracting unit 12 is connected to the receiving unit 11 and is configured to extract content information of the external sound.

Specifically, a key feature of the received electrical signal may be analyzed. Then, voice content corresponding to the electrical signal is extracted.

It should be noted that, generally, an external sound directly picked up by the microphones is mixed with noise, and a voice signal of the noise damages an original acoustic feature of the external sound, thereby deteriorating sound quality and reducing intelligibility. In order to remove a noise part from a voice signal that includes noise as much as possible to obtain a pure original sound, the apparatus in the embodiment of the present invention may further include a noise removing unit, configured to perform noise suppression on a sound picked up by the microphones. Common methods mainly include an adaptive noise cancellation method, a spectral subtraction method, a model establishment method, a noise removing method by using a filter, a blind source separation method, and the like.

A content determining unit 13 is connected to the content extracting unit 12 and is configured to determine, according to the content information of the external sound, whether a prestored sound template database includes a sound that is matched with the content information of the external sound, and generate a first determining result.

In the present invention, a sound template database may be pre-established, and content information of specified sounds is stored in the sound template database. For example, sounds of horns of vehicles, sounds of people's greetings, and so on are stored. In a specific embodiment, a user may store different specified sounds according to the user's own needs.

The sound template database may be stored in the electronic device. When the content information of the external sound is extracted, the electronic device directly searches its own sound template database to check whether there is a sound that is the same or similar to the extracted content of the external sound.

In an optional embodiment of the present invention, a sound template database may also be stored on the cloud to save storage space of an electronic device. The content determining unit may upload the extracted content information of the external sound onto the cloud for performing matching and determination, and the sound template database may also be downloaded into the electronic device for performing matching.

In the embodiment, the user may store all specified sounds into the sound template database. However, this manner needs to occupy a large amount of storage space, and lots of time and resources are required for performing searching and matching in all the specified sounds. In an actual application, in different environments, external sounds that a user needs to pay attention to differ greatly. For example, when in an indoor environment such as a gym, a user generally does not pay attention to sounds of vehicles. In view of this, the present invention provides two optional manners.

In a first manner, first, divide sounds into a plurality of sound template databases according to differences of corresponding external environments. For example, in an indoor sound template database, greeting sounds, such as "Hi" and "Hello", are stored, and in an outdoor sound template database, sounds of horns of vehicles, stop-reporting sounds of vehicles, and the like are stored. Then, make a priority division for the sound template databases. Generally, a specified sound database corresponding to a current external environment has a highest priority, and other priorities may be sequentially set. After the content extracting unit extracts the content information of the external sound, the content determining unit performs searching and matching according to priority order. Only when matching information is not found in a sound template database that has a higher priority, the electronic device continues to perform searching and matching in a sound template database that has a lower priority.

In a second manner, first, divide sounds into a plurality of sound template databases according to differences of corresponding external environments, such as the indoor sound template database and the outdoor sound template database mentioned above. Then, store only a sound template database corresponding to a current external environment in the electronic device. For example, when in a gym, by selecting an indoor environment, the content determining unit downloads a corresponding indoor sound template database from the cloud and stores the database.

A volume controlling unit 14 is connected to the content determining unit 13 and includes a volume adjusting unit 141 or a prompt tone unit 142.

The volume adjusting unit 141 is configured to, when the first determining result is yes, adjust volume of a sound that is being output. Specifically, the volume of the sound that is being output may be turned down or turned off, so that the user can hear the external sound.

The prompt tone unit 142 is configured to, when the first determining result is yes, generate a prompt tone, turn off a sound that is being output, and output the prompt tone. When the device is faulty, the volume of the sound that is being output may also be turned down or turned off. Therefore, for ease of differentiation by the user, in another embodiment of the present invention, the prompt tone unit may be used as the volume controlling unit.

It should be noted that, because the prompt tone is output after the electronic device picks up the external sound, the user does not hear the specific content of the external sound. Therefore, in an optional embodiment of the present invention, the prompt tone generating unit, when the first determining result is yes, the prompt tone unit may generate a corresponding prompt tone according to the extracted content information of the external sound, and after turning off the volume of the sound that is being output, output the corresponding prompt tone to the user. For example, a cell phone picks up an external sound "Hello", and finds, by searching and matching, a specified sound that is matched with the external sound in the sound template database. Therefore, a prompt tone "Someone is greeting you" or "Someone is saying Hello" is generated and then output to the user.

In the foregoing embodiment, it may be temporary that the volume controlling unit adjusts the volume of the sound that is being output or turns off the sound that is being output to output the prompt tone. For example, the user may set a fixed period of time. After the volume controlling unit adjusts volume or outputs a prompt tone, original volume automatically recovers after this fixed period of time. A corresponding time detecting unit may be installed in the electronic device to detect time.

For example, the user sets the fixed period of time to 2 minutes. At a certain time point, the electronic device turns off a sound that is being output and outputs a corresponding prompt tone because the electronic device picks up a specific external sound. After detecting that 2 minutes pass, the time detecting unit generates a relevant signal. Then, the volume controlling unit may adjust the sound back to the original volume according to the signal.

Certainly, in other embodiments of the present invention, it may also be set that after a volume controlling unit adjusts volume or outputs a prompt tone, a sound is consistently output at the adjusted volume or the sound is kept in a turning off state unless a user performs manual setting.

Figure 5:
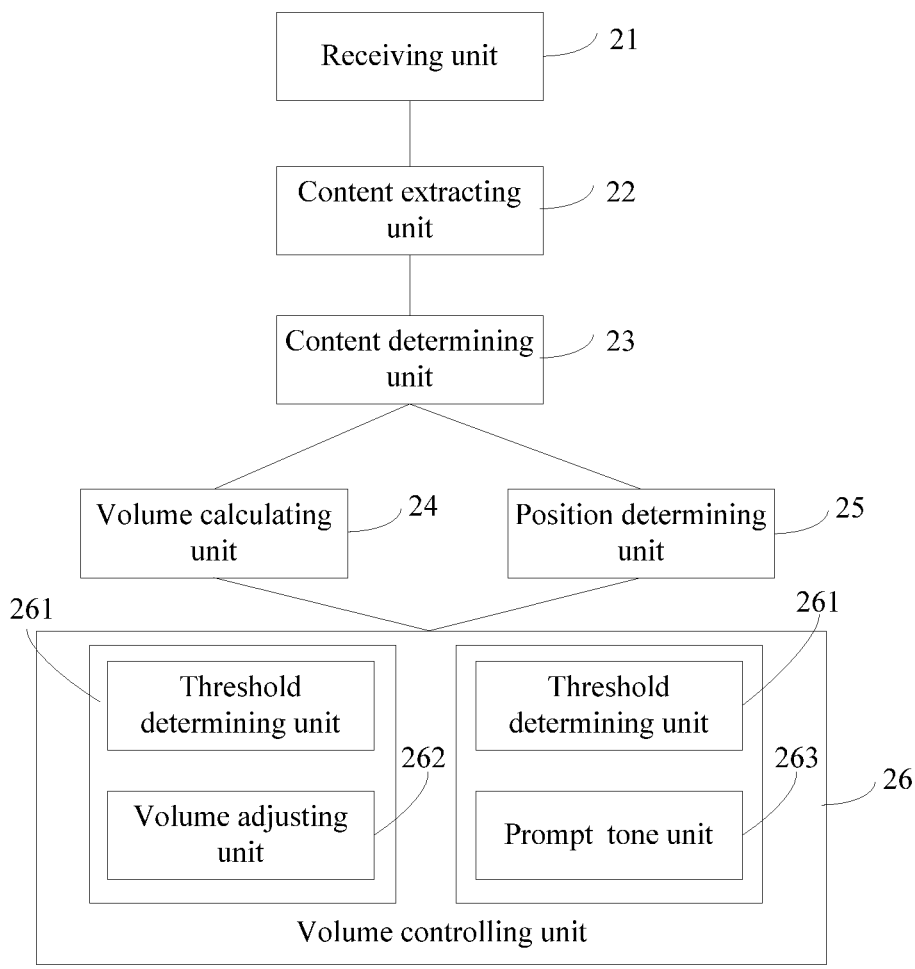
FIG. 5 is a structural diagram of an apparatus according to a fourth embodiment of the present invention.

In actual life, sounds that have same content information do not necessarily have a same impact on a user. For example, when driving on a road, a user usually neither pays attention to sounds of horns of vehicles ahead and nor pays attention to sounds of horns of vehicles that are far away from the user. Therefore, volume and a position of an external sound and a distance all have an impact on a user. In view of this, a fourth embodiment of the present invention provides an implementation apparatus for intelligently controlling volume of an electronic device. As shown in FIG. 5, the apparatus includes:

a receiving unit 21, configured to receive an external sound picked up by microphones;

a content extracting unit 22, connected to the receiving unit 21 and configured to extract content information of the external sound;

a content determining unit 23, configured to determine, according to the content information of the external sound, whether a prestored sound template database includes a sound that is matched with the content information of the external sound, and generate a first determining result; and a position determining unit 25, connected to the content determining unit 23, and configured to calculate, by using a microphone array formed by the at least two microphones, a position of the external sound and a distance between the external sound and the electronic device.

Volume of a sound source can reflect, to a certain extent, a distance between the sound source and an electronic device, so in another embodiment of the present invention, the apparatus further includes:

A volume calculating unit 24 is configured to calculate volume of the sound source of the external sound.

The volume calculating unit 24 and the position determining unit may be connected to the receiving unit 21, the content extracting unit 22, or the content determining unit 23. FIG. 5 of the present invention shows a situation that the volume calculating unit 24 and the position determining unit are connected to the content determining unit 23.

A volume controlling unit 26 is connected to the content determining unit 23 and includes: a threshold determining unit 261 and a volume adjusting unit 262, or a threshold determining unit 261 and a prompt tone unit 263, where:

the threshold determining unit 261 is configured to, when the first determining result is yes, determine whether the position of the sound source of the external sound and the distance meet a preset condition, and generate a second determining result;

when the volume calculating unit 24 is included, the threshold determining unit 261 is configured to, when the first determining result is yes, determine whether the volume and the position of the sound source of the external sound and the distance meet a preset condition, and generate a second determining result;

the volume adjusting unit 262 is specifically configured to, when the second determining result is yes, adjust volume of a sound that is being output; and the prompt tone unit 263 is specifically configured to, when the second determining result is yes, generate a prompt tone, turn off the sound that is being output, and output the prompt tone.

In the present invention, different preset conditions may be set in view of external sounds having different sound content. For example, for sounds of horns of vehicles, a preset condition may be set to: a position is in the rear and a distance is shorter than 500 meters; and for sounds of greetings, a preset condition may be set to: a distance is shorter than 200 meters.

It should be noted that, in the present invention, when a certain item in the preset condition is blank, it is considered by default that the item does not need to be determined. For example, when an item corresponding to the volume is blank, it is considered by default that sounds at all volume meet a requirement.

It should be noted that, the volume calculating unit and the position determining unit have a plurality of specific forms.

For example, the volume calculating unit may be specifically configured to calculate the volume according to a signal-to-noise ratio. Because energy of a low vowel, a high vowel, an unvoiced sound, and the like is differently distributed in different frequency bands, in an optional embodiment of the present invention, the volume calculating unit may calculate the volume in combination with a factor such as a frequency band.

The position determining unit may specifically determine the position of the external sound and the distance between the external sound and the electronic device according to a reverberation degree or a microphone frequency response, and may also determine the position of the external sound and the distance between the external sound and the electronic device according to a distributed microphone array. The distributed microphone array refers to an array formed by at least two separately distributed microphones. A theory is that a relationship between an external sound and at least two separately distributed microphones as well as a geometric positional relationship between the microphones are used to position a sound source. The distributed microphone array method is specifically divided into a beam-based algorithm, an algorithm based on high-resolution spectral estimation, and an algorithm based on an arrival delay. It should be noted that, when the beam-based algorithm and the algorithm based on high-resolution spectral estimation are used to perform a calculation, the number of the microphones is at least three.

When the algorithm based on an arrival delay is used, the position determining unit specifically includes:

A delay calculating unit is configured to calculate a sound arrival delay between array element pairs in the array formed by the at least two microphones. Specifically, the delay calculating unit may be configured to calculate an arrival delay by using a least mean square adaptive filter method, a cross power spectrum phase method, or a generalized cross-correlation function method.

A sound positioning unit is configured to calculate, according to the arrival delay and a position relationship between the microphones, the distance between the external sound and the electronic device and determine the position of the external sound. Common methods include an angular distance positioning method, a spherical interpolation method, a linear interpolation method, and an objective function spatial search positioning method. In the embodiment of the present invention, the angular distance positioning method that has moderate precision and is easy to be implemented may be used to perform the positioning. For a specific process, reference may be made to the method embodiment, and details are not repeatedly described herein.

When the arrival delay is calculated, because the method based on a generalized cross-correlation function has a small calculating amount and high calculating efficiency, in the embodiment of the present invention, the delay calculating unit may use this method.

Figure 6:
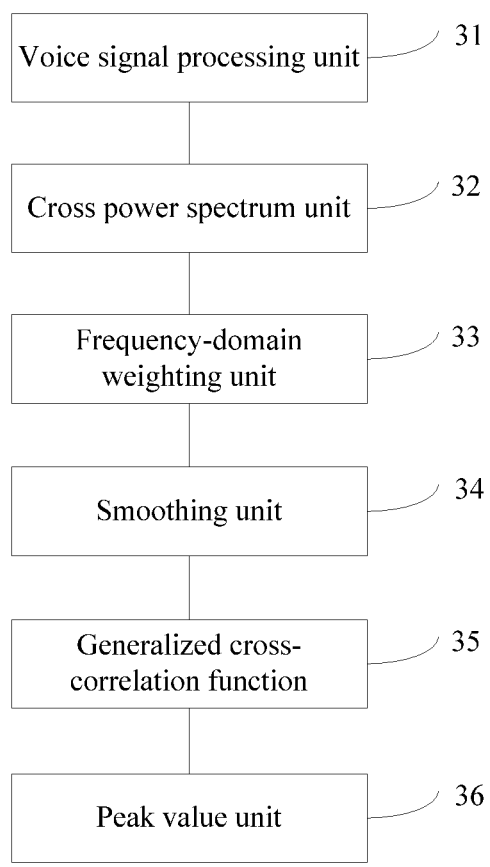
FIG. 6 is a structural diagram of a delay calculating unit according to an embodiment of the present invention.

As shown in FIG. 6, in this case, the delay calculating unit specifically includes:

a voice signal processing unit 31, configured to perform A/D sampling and low pass filtering on a voice signal of an external sound obtained by array element pairs, a microphone 1 and a microphone 2, to obtain a voice signal to be processed, where in a specific application, the microphones 1 and 2 may be set at will; however, in order to achieve a better effect, the microphones 1 and 2 need to ensure a good sealing effect and cannot be placed at a position that may be easily covered by a hand; it is best to place the microphones on a central axis of the electronic device and isolate the two microphones from each other to a certain extent;

a cross power spectrum unit 32, configured to, after the voice signal to be processed passes a FIR band pass filter, perform framing by using a half overlapping hamming window and Fourier transform to obtain a cross power spectrum of the voice signal to be processed;

a frequency-domain weighting unit 33, configured to perform frequency-domain weighting on the voice signal to be processed to obtain a power spectrum after the weighting, so as to reduce impacts of noise and reverberation, where this unit is an optional unit;

a smoothing unit 34, configured to smooth a power spectrum between microphone signals to obtain a power spectrum after the smoothing, where this unit is an optional unit;

a generalized cross-correlation function unit 35, configured to calculate an inverse Fourier transform value of the power spectrum to obtain a generalized cross-correlation function between the microphone array element pairs; and a peak value unit 36, configured to calculate a peak value of the generalized cross-correlation function, namely the arrival delay between the microphone array element pairs.

It should be noted that, when specifically determining whether the volume, the position, and the distance meet the preset condition, the threshold determining unit may set the preset condition in a threshold circuit in a form of preset thresholds, and then input the volume and the position of the external sound and the distance into the threshold circuit for a comparison. When the volume and the position of the external sound and the distance are greater than the preset thresholds, the threshold determining unit considers that the preset condition is met and outputs a high-level signal to an audio processing chip. When the volume and the position of the external sound and the distance are less than the preset thresholds, the threshold determining unit considers that the preset condition is not met and outputs a low-level signal to the audio processing chip. The volume adjusting unit is specifically configured to, when the high-level signal is received, call an automatic gain control AGC function by using the audio processing chip to adjust the volume of the sound that is being output. The prompt tone unit is specifically configured to, when the high-level signal is received, call an automatic gain control AGC function by using the audio processing chip to generate a prompt tone, turn off the sound that is being output, and output the prompt tone.

Another embodiment of the present invention provides a hardware architecture of an implementation apparatus for intelligently controlling volume of an electronic device, where the hardware architecture includes at least one microphone, at least one processor (such as a CPU), at least one network interface or another communication interface, a memory, at least one audio output device, and at least one communication bus that is configured to implement connection communication between these apparatuses. The microphone is configured to pick up an external sound, and the processor is configured to execute an executable module stored in the memory, such as a computer program. The memory may include a high speed random access memory (RAM: Random Access Memory), and may further include a non-volatile memory (non-volatile memory), for example, at least one magnetic disk memory. A communication connection between a system gateway and at least one other network element is implemented through at least one network interface (which may be wired or wireless), and the Internet, a wide area network, a local area network, a metropolitan area network or the like may be used. The output device is configured to output various types of sounds including prompt tones.

In some implementation manners, a memory stores a program instruction. The program instruction may be executed by a processor, and the program instruction includes: a receiving unit 11, a content extracting unit 12, a content determining unit 13, and a volume controlling unit 14 (a volume adjusting unit 141 or a prompt tone unit 142), where, for specific implementation of each unit, reference is made to corresponding units shown in FIG. 4, and details are not repeatedly described herein.

Certainly, in other embodiments, the memory also includes another program instruction, such as a position determining unit, a volume calculating unit, or units 31 to 36 shown in FIG. 6.

It should be noted that the apparatus in the foregoing embodiments may also be an electronic device itself.

The implementation apparatus of the present invention corresponds to the method embodiments of the present invention. For a related part, reference may be made to the method embodiments, and details are not described in detail herein.

The method and the implementation apparatus for intelligently controlling volume of an electronic device provided by the present invention are introduced in detail in the foregoing. The principle and implementation manners of the present invention are described herein by applying specific examples herein. The foregoing description about the embodiments is merely provided for ease of understanding of the method and the core idea of the present invention. Meanwhile, persons of ordinary skill in the art can make variations to the specific implementation manners and application scopes according to the ideas of the present invention. In conclusion, the content of the specification shall not be construed as a limitation to the present invention.

What is claimed is:

1. A method for intelligently controlling volume of an electronic device, wherein the electronic device comprises microphones, the method comprising:
   receiving an external sound picked up by the microphones;
   extracting content information of the external sound;
   determining, according to the content information of the external sound, whether a prestored sound template database comprises a sound that is matched with the content information of the external sound, and generating a first determining result;
   generating a second determining result based on determining whether a position of a sound source of the external sound and whether a distance between the sound source and the electronic device meet a preset condition; and
   when the first determining result indicates a match and when the second determining result indicates the preset condition is met:
   adjusting volume of a sound that is being output; or
   generating a prompt tone, turning off a sound that is being output, and outputting the prompt tone.

2. The method according to claim 1, wherein the generating the prompt tone, turning off the sound that is being output, and outputting the prompt tone comprises:
   generating a corresponding prompt tone according to the content information of the external sound, turning off the sound that is being output, and outputting the corresponding prompt tone.

3. The method according to claim 1,
   wherein the method further comprises, before the adjusting volume of the sound that is being output or before the generating the prompt tone, turning off the sound that is being output, and outputting the prompt tone:
   calculating, according to a microphone array formed by the microphones, the position of a sound source of the external sound and the distance between the sound source of the external sound and the electronic device.

4. The method according to claim 3, wherein the calculating, by using a microphone array formed by the microphones, a position of the external sound and a distance between the external sound and the electronic device comprises:
   calculating a sound arrival delay between array element pairs formed by two microphones in the array formed by the microphones; and
   calculating, according to the arrival delay and a position relationship between the microphones, the distance between the external sound and the electronic device, and determining the position of the external sound.

5. The method according to claim 3:
   wherein the determining whether the position of the sound source of the external sound and the distance meet a preset condition and generating a second determining result comprises:
   inputting the position of the sound source and the distance into a threshold circuit, comparing the position of the sound source and the distance with corresponding preset thresholds in the threshold circuit respectively, and generating a comparing result; and
   outputting a high-level signal to an audio processing chip when the comparing result conforms to a preset relationship; otherwise, outputting a low-level signal to the audio processing chip; and
   wherein the adjusting the volume of the sound that is being output, or generating the prompt tone, turning off the sound that is being output, and outputting the prompt tone comprises, when the high-level signal is received, calling an automatic gain control AGC function by using the audio processing chip to adjust the volume of the sound that is being output, or generate the prompt tone, turn off the sound that is being output, and output the prompt tone.

6. The method according to claim 1, wherein the microphones are omnidirectional microphones.

7. An apparatus for intelligently controlling volume of an electronic device, wherein the electronic device comprises microphones, the apparatus comprising a processor, and a non-transitory computer-readable medium storing program units executable by the processor, the program units comprising:
   a receiving unit, configured to receive an external sound picked up by the microphones;
   a content extracting unit, configured to extract content information of the external sound;
   a content determining unit, configured to determine, according to the content information of the external sound, whether a prestored sound template database comprises a sound that is matched with the content information of the external sound, and generate a first determining result; and a volume controlling unit, configured to control volume when the first determining result indicates a match, wherein the volume controlling unit comprises a condition determining unit, wherein the condition determining unit is configured to, when the first determining result indicates the match, determine whether a position of a sound source of the external sound and a distance between the sound source and the electronic device meet a preset condition, and generate a second determining result, wherein the volume controlling unit is further configured to, when the first determining result indicates the match and when the second determining result indicates the preset condition is met, adjust volume of a sound that is being output; or generate a prompt tone, turn off a sound that is being output, and output the prompt tone.

8. The apparatus according to claim 7, wherein the prompt tone generating unit is configured to, when the first determining result indicates the match, generate a corresponding prompt tone according to the content information of the external sound, turn off the sound that is being output and generate the corresponding prompt tone.

9. The apparatus according to claim 7, wherein the apparatus further comprises:

a position determining unit configured to calculate, according to a microphone array formed by the microphones, a position of a sound source of the external sound and a distance between the sound source of the external sound and the electronic device.

10. The apparatus according to claim 9, wherein the position determining unit comprises:

a delay calculating unit, configured to calculate a sound arrival delay between array element pairs formed by two microphones in the array formed by the microphones; and a sound positioning unit, configured to calculate, according to the arrival delay and a position relationship between the microphones, the distance between the external sound and the electronic device, and determine the position of the external sound.

11. The apparatus according to claim 9, wherein the microphones are omnidirectional microphones.

12. The apparatus according to claim 9:

wherein the condition determining unit is configured to input the position of the sound source and the distance into a threshold circuit;

compare the position of the sound source and the distance with preset thresholds in the threshold circuit respectively;

generate a comparing result; and when the comparing result conforms to a preset relationship, output a high-level signal to an audio processing chip; otherwise, output a low-level signal to the audio processing chip;

wherein the volume controlling unit is configured to, when the high-level signal is received, call an automatic gain control AGC function by using the audio processing chip to adjust the volume of the sound that is being output or to generate the prompt tone, turn off the sound that is being output, and output the prompt tone.

13. An apparatus for intelligently controlling volume of an electronic device, wherein the electronic device comprises microphones, wherein the apparatus comprises:

a processor; and a computer-readable storage medium storing a program to be executed by the processor, the program including instructions for:

receiving an external sound picked up by the microphones;

extracting content information of the external sound;

determining, according to the content information of the external sound, whether a prestored sound template database comprises a sound that is matched with the content information of the external sound, and generating a first determining result;

generating a second determining result based on determining whether a position of a sound source of the external sound and whether a distance between the sound source and the electronic device meet a preset condition; and when the first determining result indicates a match and when the second determining result indicates the preset condition is met:

adjusting volume of a sound that is being output; or generating a prompt tone, turning off a sound that is being output, and outputting the prompt tone.

* * * * *